United States Patent
Lien et al.

(12) 
(10) Patent No.: US 11,003,529 B2
(45) Date of Patent: *May 11, 2021

(54) ENCODING METHOD AND MEMORY STORAGE APPARATUS USING THE SAME

(71) Applicant: Winbond Electronics Corp., Taichung (TW)

(72) Inventors: Chuen-Der Lien, San Jose, CA (US); Ming-Huei Shieh, San Jose, CA (US); Chi-Shun Lin, San Jose, CA (US); Ngatik Cheung, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 73 days.

This patent is subject to a terminal disclaimer.

(21) Appl. No.: 16/509,492

(22) Filed: Jul. 12, 2019

(65) Prior Publication Data

US 2019/0340070 A1    Nov. 7, 2019

Related U.S. Application Data

(63) Continuation-in-part of application No. 16/034,365, filed on Jul. 13, 2018, now abandoned, which is a continuation-in-part of application No. 15/933,367, filed on Mar. 22, 2018, now Pat. No. 10,514,980.

(51) Int. Cl.
*H03M 13/00* (2006.01)
*G06F 11/10* (2006.01)
*H03M 13/45* (2006.01)
*G11C 29/52* (2006.01)

(52) U.S. Cl.
CPC .......... *G06F 11/1068* (2013.01); *G11C 29/52* (2013.01); *H03M 13/458* (2013.01)

(58) Field of Classification Search
CPC ... G06F 11/1068; G11C 29/52; H03M 13/458
See application file for complete search history.

(56) References Cited

U.S. PATENT DOCUMENTS

| | | | | |
|---|---|---|---|---|
| 7,904,793 B2 * | 3/2011 | Mokhlesi | ............ | G11C 29/028 714/780 |
| 9,384,144 B1 * | 7/2016 | Yeung | ................. | G06F 12/0246 |
| 9,575,125 B1 * | 2/2017 | Andre | .................... | G11C 29/42 |
| 9,632,866 B2 * | 4/2017 | Calderbank | ............ | G11C 16/06 |
| 9,780,809 B2 * | 10/2017 | Tuers | .................... | H03M 13/45 |
| 10,002,086 B1 * | 6/2018 | Achtenberg | ........ | G06F 13/1673 |

(Continued)

*Primary Examiner* — Esaw T Abraham
(74) *Attorney, Agent, or Firm* — JCIPRNET

(57) ABSTRACT

An encoding method for a memory storage apparatus adopting an ECC algorithm is provided. The memory storage apparatus comprises an ECC encoder. The encoding method includes: receiving a write command comprising a write address and a write data; reading an existing codeword; attaching a flip bit to the write data; encoding the write data and the flip bit to generate parity bits based on the ECC algorithm by the ECC encoder and attaching the write data and the flip bit to the plurality of parity bits to generate a new codeword; flipping the new codeword based on a number of bits among selected bits required to be changed from the existing codeword to the new codeword; and writing one of the new codeword and the flipped new codeword to the write address. In addition, a memory storage apparatus using the encoding method is provided.

12 Claims, 7 Drawing Sheets

(56) References Cited

U.S. PATENT DOCUMENTS

| | | | |
|---|---|---|---|
| 10,198,313 B2* | 2/2019 | Barndt | G06F 11/073 |
| 10,256,842 B2* | 4/2019 | Kwok | H03M 13/2927 |
| 2004/0003165 A1* | 1/2004 | Schulz | G06F 11/1032 |
| | | | 711/5 |
| 2004/0003339 A1* | 1/2004 | Cypher | G06F 11/10 |
| | | | 714/776 |

* cited by examiner

ENCODING METHOD AND MEMORY STORAGE APPARATUS USING THE SAME

CROSS-REFERENCE TO RELATED APPLICATION

This application is a continuation-in-part application of and claims the priority benefit of a prior application Ser. No. 16/034,365, filed on Jul. 13, 2018, now abandoned. The application Ser. No. 16/034,365 is a continuation-in-part application of and claims the priority benefit of a prior application Ser. No. 15/933,367, filed on Mar. 22, 2018, now allowed. The entirety of each of the above-mentioned patent applications is hereby incorporated by reference herein and made a part of this specification.

BACKGROUND OF THE INVENTION

1. Field of the Invention

The invention relates to a memory storage device, and more particularly, relates to an encoding method and a memory storage apparatus using the encoding method.

2. Description of Related Art

Generally, data to be written to a rewritable non-volatile memory (NVM) may be encoded into a codeword according to an error correcting codes (ECC). The codeword read from the rewritable non-volatile memory may also be processed by a corresponding decoding procedure to restore to the data. The codeword, is usually a combination of the data itself and a parity data generated according to the Bose-Chaudhuri-Hocquenghem (BCH) code, the hamming code, the hamming code with additional parity (SECDED), the Reed-Solomon code, the Hsiao code, or the Lien code etc.

To improve NVM write power, write time and cycling reliability, an approach and an on-chip ECC algorithm are required to achieve low power design and page write time reduction and improve device reliability.

SUMMARY OF THE INVENTION

Accordingly, the invention is directed to an encoding method and a memory storage apparatus using the encoding method, in which a NVM flip bit write function is implemented with an ECC algorithm so as to reduce write time, write power and improve reliability.

An exemplary embodiment of the invention provides an encoding method for a memory storage apparatus adopting an error correcting code (ECC) algorithm. The encoding method includes: receiving a write command comprising a write address and a write data; reading an existing codeword; attaching a flip bit to the write data; encoding the write data and the flip bit to generate a plurality of parity bits based on a default ECC by an ECC encoder and attaching the write data and the flip bit to the plurality of parity bits to generate a new codeword; flipping the new codeword based on a number of bits required to be changed among selected bits from the existing codeword to the new codeword; and writing one of the new codeword and the flipped new codeword to the write address.

Another exemplary embodiment of the present invention provides a memory storage apparatus adopting an ECC algorithm. The memory storage apparatus includes a connection interface, a memory array and a memory control circuit. The connection interface is configured to couple to a host system. The memory control circuit is coupled to the connection interface and the memory array, and configured to perform an encoding operation based on the ECC algorithm in response to receiving a write command comprising a write address and a write data. The encoding operation comprises reading an existing codeword; attaching a flip bit to the write data; encoding the write data and the flip bit to generate a plurality of parity bits based on the ECC algorithm by an ECC encoder and attaching the write data and the flip bit to the plurality of parity bits to generate a new codeword; flipping the new codeword based on a number of bits among selected bits required to be changed from the existing codeword to the new codeword; and writing one of the new codeword and the flipped new codeword to the write address.

Based on the above, by adopting the encoding method and the memory storage apparatus provided in the invention, in response to receiving a write command, write data is encoded and compared with an existing codeword in the write address or with a pre-defined pattern so as to determine the number of bits required to be changed in writing. The bits of the encoded codeword are selectively flipped based on the determined number and at least one flip bit indicating bit-flipping are added to the codeword. As a result, the number of bit change in writing can be reduced and write time and power can be reduced.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
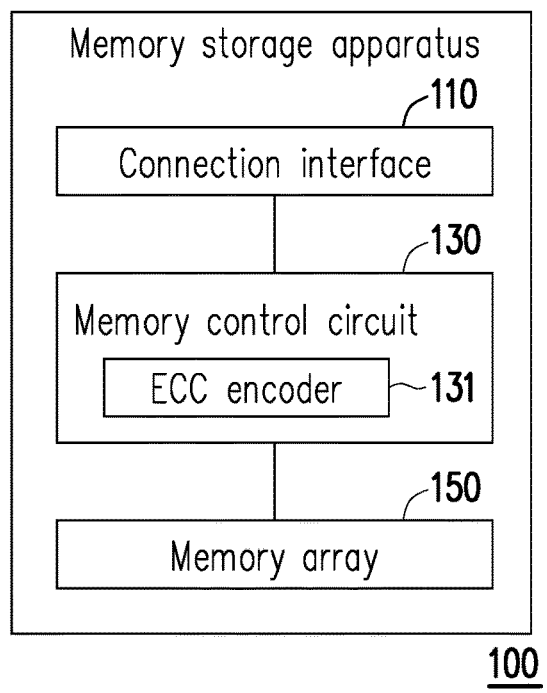
FIG. 1 is a schematic block diagram illustrating a memory storage apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, the memory storage apparatus 100 includes a connection interface 110, a memory control circuit 130, and a memory array 150. In one embodiment, the memory storage apparatus 100 is a rewritable non-volatile memory, and the memory array 150 includes a plurality of rewritable non-volatile memory cells.

In one embodiment, the connection interface 110 is configured to couple to a host system (not shown) through a Serial Advanced Technology Attachment (SATA) standard. In other embodiments, the connection interface 110 may comply with the Parallel Advanced Technology Attachment (PATA) standard, the Institute of Electrical and Electronic Engineers (IEEE) 1394 standard, or other suitable standards, which is not limited in the invention. In one embodiment, the connection interface 110 may be packaged with the memory control circuit unit 130 in one chip or laid outside a chip having the memory control circuit unit 130.

The memory control circuit 130 is coupled to the connection interface 110 and the memory array 150, and configured to execute a plurality of logic gates or control commands which are implemented in a hardware form or in a firmware form and perform operations such as data writing, reading or erasing in the memory array 150 according to the command of the host system.

In one embodiment, the memory storage apparatus 100 is a rewritable NVM adopting an ECC algorithm, where the memory control circuit 130 further includes an ECC encoder 131 using the ECC algorithm for encoding the data received through the connection interface 110, so as to generate a codeword and write the same into the memory array 150. It is noted that in this invention, one's complement of a codeword generated by the ECC algorithm is still another codeword. The ECC algorithm is, for example, an ECC modified by Lien Code, Bose-Chaudhuri-Hocquenghem (BCH) code, hamming code, hamming code with additional parity (SECDED), Reed-Solomon code, or Hsiao code, etc., which is not limited herein.

The memory array 150 is coupled to the memory control circuit 130 including a plurality of memory cells (e.g., rewritable non-volatile memory cells). In one embodiment, the host system transmits a write command to the memory storage apparatus 100 for writing data thereto, and then the memory control circuit 130 encodes the write data into a codeword and stores the codeword in the memory array 150, in response to the write command.

Figure 2:
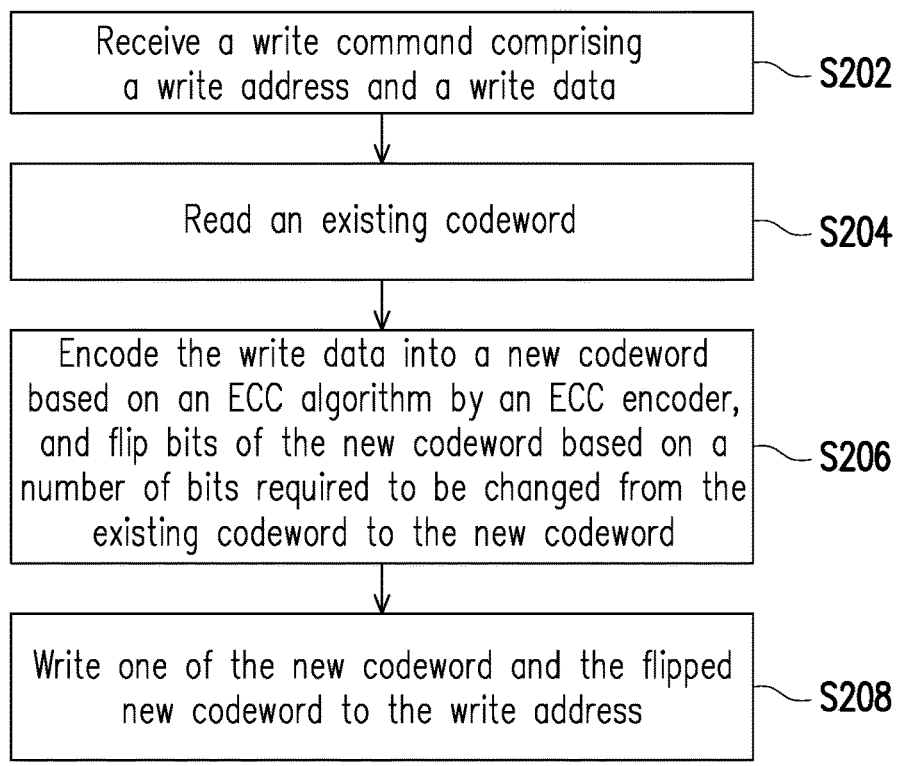
FIG. 2 is a flowchart illustrating an encoding method for a memory storage apparatus according to an embodiment of the invention.

FIG. 2 is a flowchart illustrating an encoding method for a memory storage apparatus according to an embodiment of the invention. The encoding method may be performed by the memory storage apparatus 100 of the embodiment of FIG. 1. Therefore, the encoding method will be illustrated by referring to the aforementioned memory storage apparatus 100 in the present embodiment.

Referring to FIG. 2, the memory control circuit 130 receives a write command comprising a write address and a write data through the connection interface 110 (step S202). In response to the received write command, the ECC encoder 131 of the memory control circuit 130 previously reads an existing codeword (step S204). In one embodiment, the existing codeword is a codeword previously stored in the write address, and in another embodiment, the existing codeword is a codeword with a predefined data pattern (e.g., 000000 . . . , or FFFFFF . . . ), which is not limited herein.

Meanwhile, the ECC encoder 131 encodes the write data into a new codeword based on an ECC algorithm as described above and flips a plurality of bits of the new codeword based on a number of bits required to be changed from the existing codeword to the new codeword (step S206). To be specific, the ECC encoder 131 may attach a flip bit to the write data, calculate a parity data of the write data and the flip bit based on the ECC algorithm, and combine the parity data, the write data, and the flip bit to generate the new codeword in the step S206. Then, the ECC encoder 131 compares a plurality of selected bits of the new codeword with a plurality of selected bits of the existing codeword to determine the number of bits required to be changed from the existing codeword to the new codeword and determines whether the determined number of bits required to be changed is over a predetermined threshold. It is noted that in this invention, one's complement of the encoded new codeword is also a codeword.

In some embodiments, the predetermined threshold is half of the total number of the data bits and the parity bits, which is not limited herein.

If the determined number of bits is determined as over the predetermined threshold, the ECC encoder 131 flips the bits of the new codeword comprising the data bits, the parity bits, and the flip bit. On the other hand, if the determined number of bits is determined as lower than the predetermined threshold, the ECC encoder 131 does not perform the bit-flipping on the bits of the new codeword. It is noted that if the predetermined threshold is equal to a half of the number of codeword bits and the determined number of bits is determined as equal to the predetermined threshold, that is, the number of bits to be changed is the same as a number of bits not to be changed, the ECC encoder 131 also does not perform the bit-flipping on the bits of the encoded new codeword.

Finally, the ECC encoder 131 writes one of the new codeword and the flipped new codeword to the write address (step S208).

Based on the above, since the number of bits changed from the existing codeword to the new codeword is reduced to be less than a half of the number of codeword bits by selectively flipping the bits of the codeword to be written, the write time and power can be reduced and the reliability and the endurance can be improved.

Figure 3:
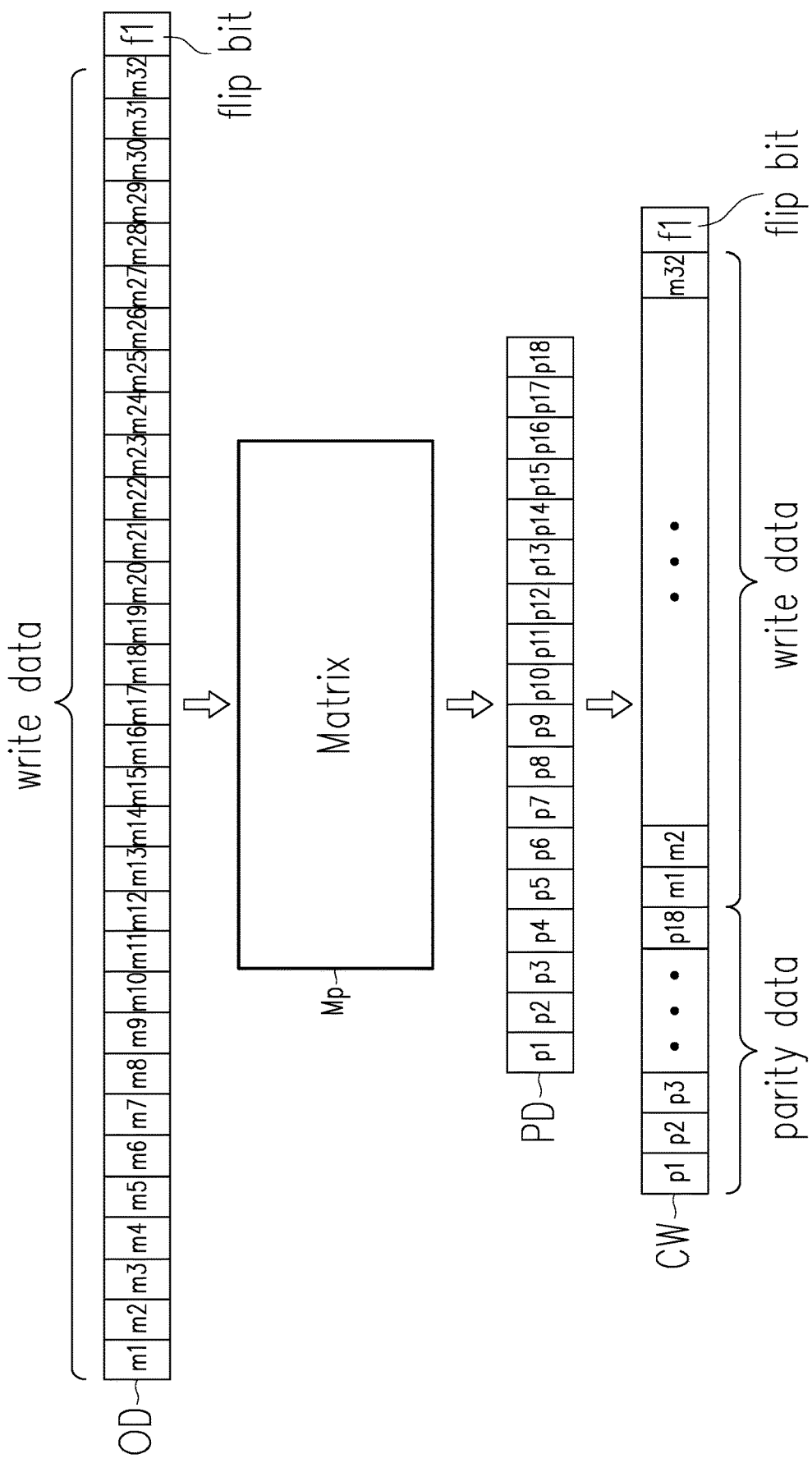
FIG. 3 is a schematic diagram illustrating an encoding method adopting an ECC algorithm modified by BCH (51, 33, 7) according to another embodiment of the invention.

For example, FIG. 3 is a schematic diagram illustrating an encoding method adopting an ECC algorithm modified by BCH (51, 33, 7) according to another embodiment of the invention.

Referring to FIG. 3, based on the ECC algorithm modified by BCH (51, 33, 7), the ECC encoder 131 encodes a 33-bit data OD including 32-bit write data m1 to m32 and one flip bit f1 into a 51-bit codeword CW, and the matrix Mp is an 18*33 matrix used for calculating an 18-bit parity data PD of the 33-bit data OD. To be specific, when the memory storage apparatus 100 receives the 32-bit write data, the ECC encoder 131 first attaches the flip bit f1 to the 32-bit write data. Then, the 33-bit data OD including the 32-bit write data and the flip bit f1 may be written in a one-column vector. The 33-bit data OD is then multiplied by the matrix Mp, so as to obtain a one-column vector with 18 elements p1 to p18 each represents one bit of the 18-bit parity data PD. Then, the ECC encoder 131 attaches the 33-bit data OD to the 18-bit parity data PD to generate the 51-bit new codeword CW.

In some embodiments, the flip bit f1 indicates bit-flipping of the codeword. In some embodiments, the flip bit f1 attached is set with a first value (i.e. logic 1) which indicate no bit-flipping of the codeword. When bit-flipping is performed to the codeword, the flip bit f1 is also flipped to a second value (i.e. logic 0) which indicates the bit-flipping of the codeword.

Based on the encoding method described above, the new codeword comprising the flip bit is generated from the write data by the ECC encoder 131. It is noted, in one embodiment, the bits changed from the existing codeword read from the write address to the new codeword are minimized, and in another embodiment, the bits changed from the existing codeword with a predefined data pattern to the new codeword are minimized. Exemplary embodiments are given below for further illustration.

Figure 4:
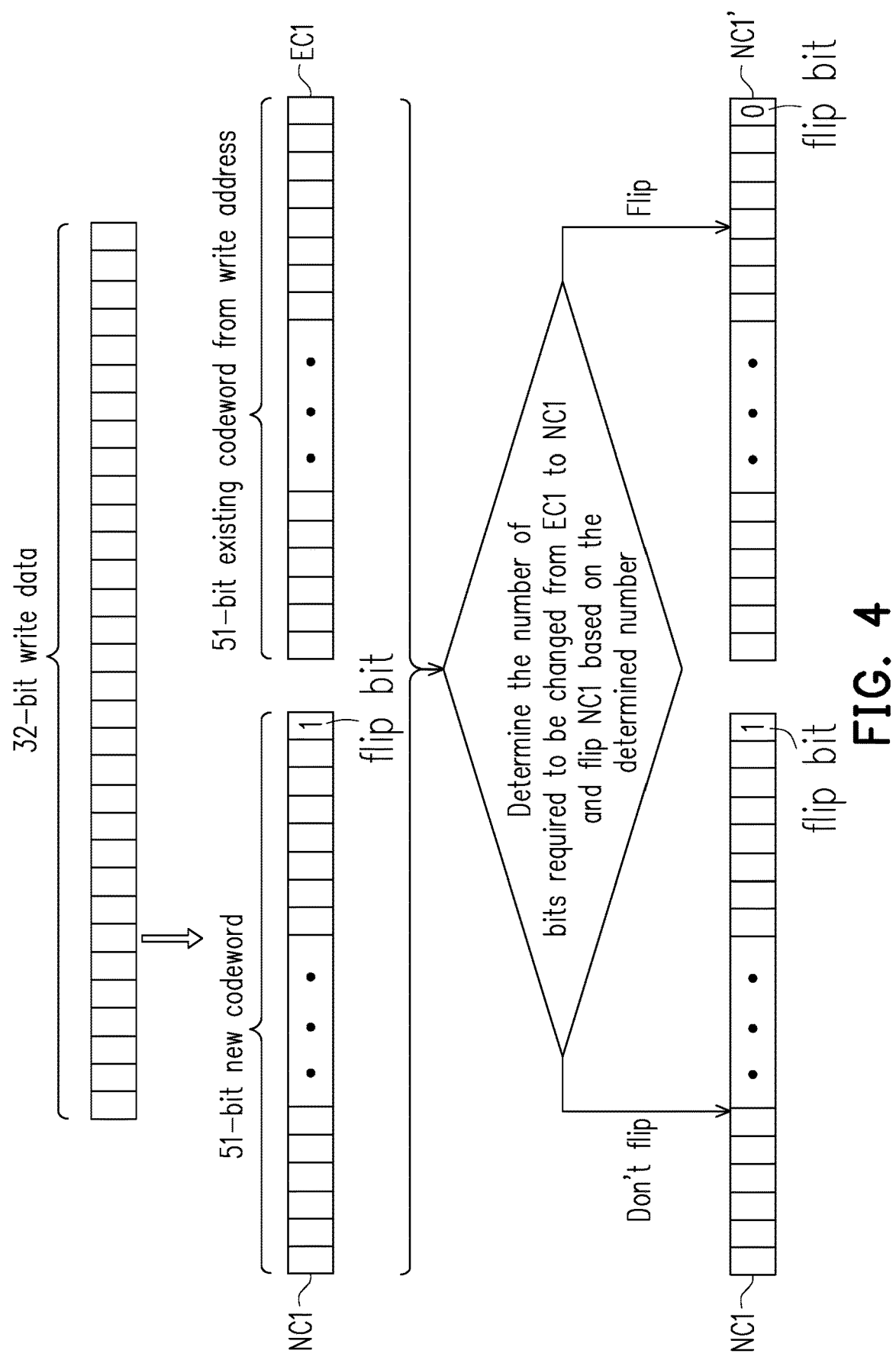
FIG. 4 is a schematic diagram illustrating an encoding method adopting an ECC algorithm modified by BCH (51, 33, 7) according to another embodiment of the invention.

FIG. 4 is a schematic diagram illustrating an encoding method adopting an ECC algorithm modified by BCH (51, 33, 7) according to another embodiment of the invention. Referring to FIG. 4, when receiving a write data, the ECC encoder 131 encodes the write data into a 51-bit new codeword NC1 by using the ECC algorithm as described in the embodiment of FIG. 3. The ECC encoder 131 also reads out a 51-bit existing codeword EC1 from the write address. Then, the ECC encoder 131 compares a plurality of bits of the new codeword NC1 with a plurality of bits of the existing codeword EC1 to determine the number of bits required to be changed from the existing codeword EC1 to the new codeword NC1. Finally, the ECC encoder 131 flips the bits of the new codeword NC1 comprising the write data, the parity bits, and the flip bit based on the determined number, and writes one of the new codeword NC1 and the flipped new codeword NC1' to the write address. Specifically, the ECC encoder 131 determines whether the determined number is over half of a number of codeword bits. If yes, the ECC encoder 131 flips all the bits of the new codeword NC1 and writes the flipped new codeword NC1' comprising the flip bit to the write address. If the determination result is no, the ECC encoder 131 does not perform bit-flipping on the new codeword NC1 and writes the new codeword NC1 to the write address.

Figure 5:
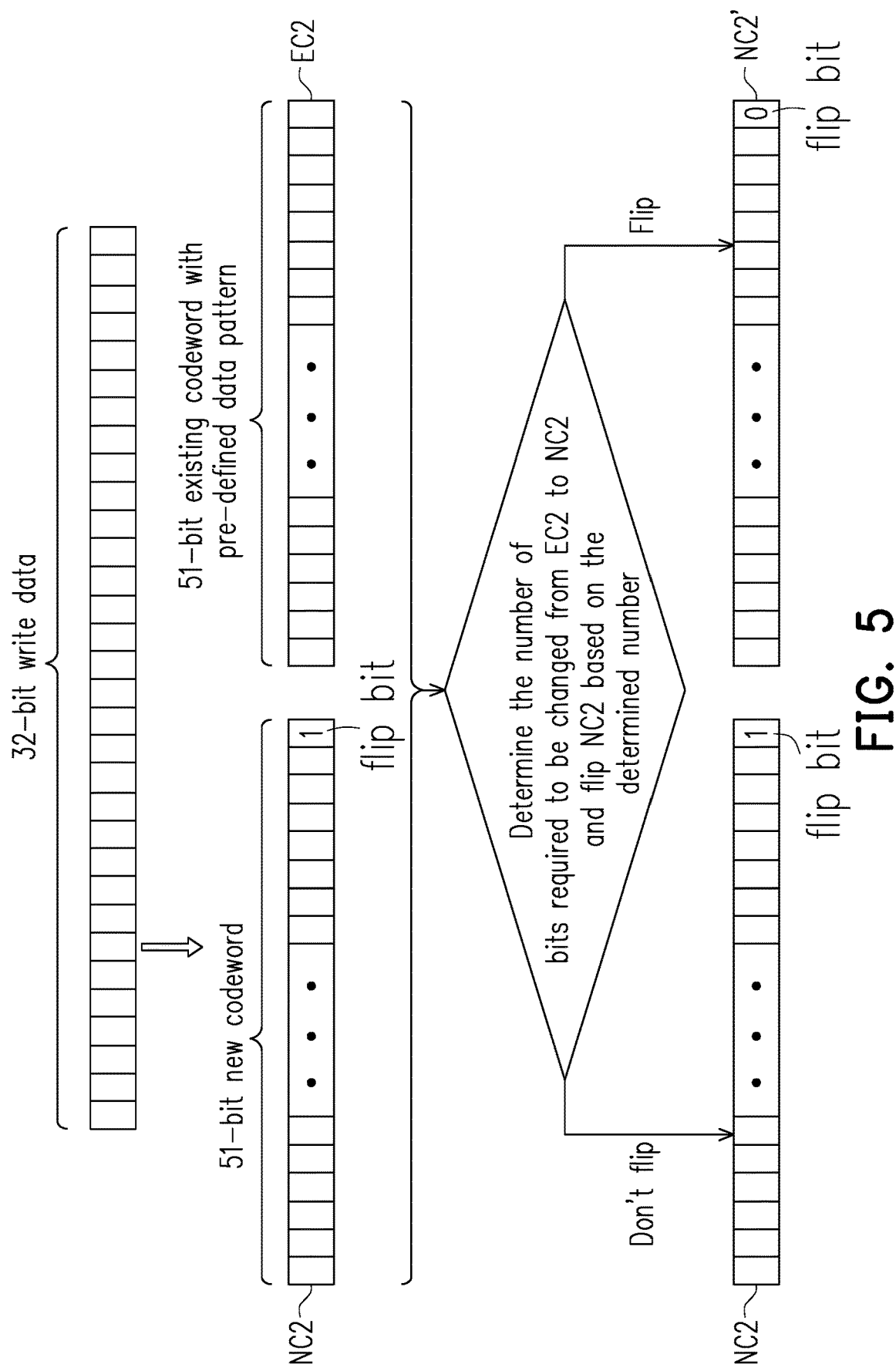
FIG. 5 is a schematic diagram illustrating an encoding method adopting an ECC algorithm modified by BCH (51, 33, 7) according to another embodiment of the invention.

On the other hand, FIG. 5 is a schematic diagram illustrating an encoding method adopting an ECC algorithm modified by BCH (51, 33, 7) according to another embodiment of the invention. Referring to FIG. 5, when receiving a write data, the ECC encoder 131 encodes the write data into a 51-bit new codeword NC2 by using the ECC algorithm as described in the embodiment of FIG. 3. The ECC encoder 131 also reads out a 51-bit existing codeword EC2 with a predefined data pattern such as 000000 . . . . Then, the ECC encoder 131 compares a plurality of bits of the new codeword NC2 with a plurality of bits of the existing codeword EC2 to determine the number of bits required to be changed from the existing codeword EC2 to the new codeword NC2. Finally, the ECC encoder 131 flips the bits of the new codeword NC2 comprising the write data, the parity bits, and the flip bit based on the determined number, and writes one of the new codeword NC2 and the flipped new codeword NC2' to the write address. Specifically, the ECC encoder 131 determines whether the determined number is over half of a number of codeword bits. If yes, the ECC encoder 131 flips all the bits of the new codeword NC2 and writes the flipped new codeword NC2' comprising the flip bit to the write address. If the determination result is no, the ECC encoder 131 does not perform bit-flipping on the new codeword NC2 and writes the new codeword NC2 to the write address.

It is noted, since the parity bits generated by the ECC algorithm (e.g. the parity bits p1 to p18 in FIG. 3) always change along with the change of write data (even one-bit change), those parity bits are expected to be frequently written then the write data (e.g. the write data in FIG. 3). In this case, even if the number of bits required to be changed in parity bits is large, the codeword may not be flipped due to fewer bits required to be changed in write data (i.e. a total number of bits required to be changed is less than half of a number of codeword bits). As a result, the cycling times of the parity bits cannot be effectively reduced if the bit-flipping is determined by the total number of the data bits and parity bits. Therefore, in the following embodiment, the encoding method may determine the bit-flipping only based on the parity bits required to be changed from existing codeword to the new codeword, so as to further improve bit write endurance, but the disclosure is not limited thereto.

Figure 6:
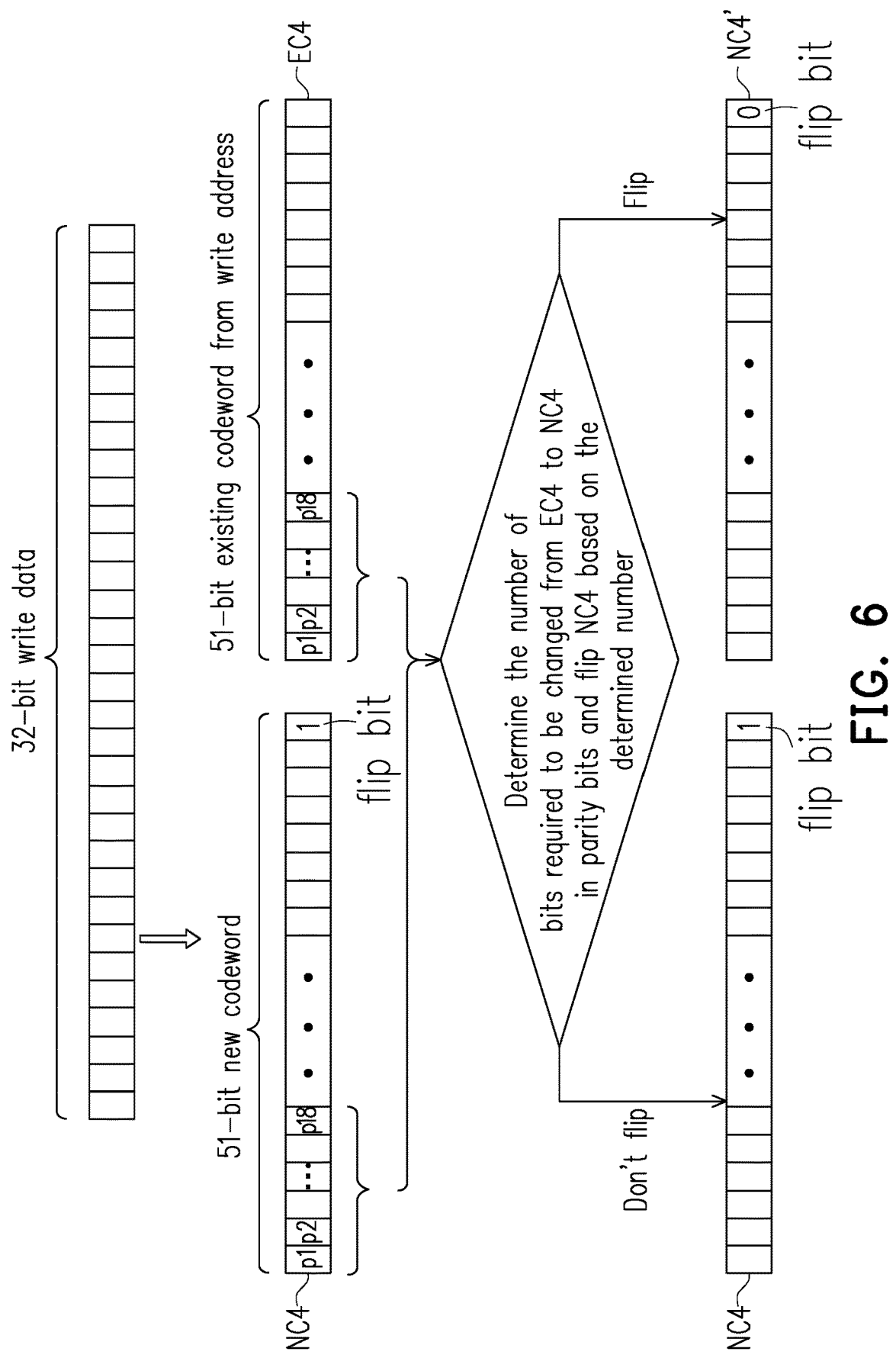
FIG. 6 is a schematic diagram illustrating an encoding method adopting an ECC algorithm modified by BCH (51, 33, 7) according to another embodiment of the invention.

For example, FIG. 6 is a schematic diagram illustrating an encoding method adopting an ECC algorithm modified by BCH (51, 33, 7) according to another embodiment of the invention. Referring to FIG. 6, when receiving a write data, the ECC encoder 131 encodes the write data into a 51-bit new codeword NC4 by using the ECC algorithm as described in the embodiment of FIG. 3. The ECC encoder 131 also reads out a 51-bit existing codeword EC4 from the write address. Then, the ECC encoder 131 compares a plurality of parity bits p1 to p18 of the new codeword NC4 with a plurality of parity bits p1 to p18 of the existing codeword EC4 to determine the number of bits required to be changed from the existing codeword EC4 to the new codeword NC4 in parity bits. Finally, the ECC encoder 131 flips the bits of the new codeword NC4 based on the determined number, and writes one of the new codeword NC4 and the flipped new codeword NC4' to the write address. Specifically, the ECC encoder 131 determines whether the determined number is over half of a number of parity bits. If yes, the ECC encoder 131 flips all the bits of the new codeword NC4 and writes the flipped new codeword NC4' comprising the flip bit to the write address. If the determination result is no, the ECC encoder 131 does not perform bit-flipping on the new codeword NC4 and writes the new codeword NC4 to the write address.

To further reduce write time and power, in some embodiments, multiple flip bits are adopted to respectively indicate the bit-flipping of different portions of the cordword, and in some embodiments, the flip bits are also contained in different portions of the cordword, which is not limited herein. In one embodiment, the flip bits include a first flip bit contained in one of a plurality of even bits of the codeword for indicating the bit-flipping of the even bits and a second flip bit contained in one of a plurality of odd bits of the codeword for indicating the bit-flipping of the odd bits.

Figure 7:
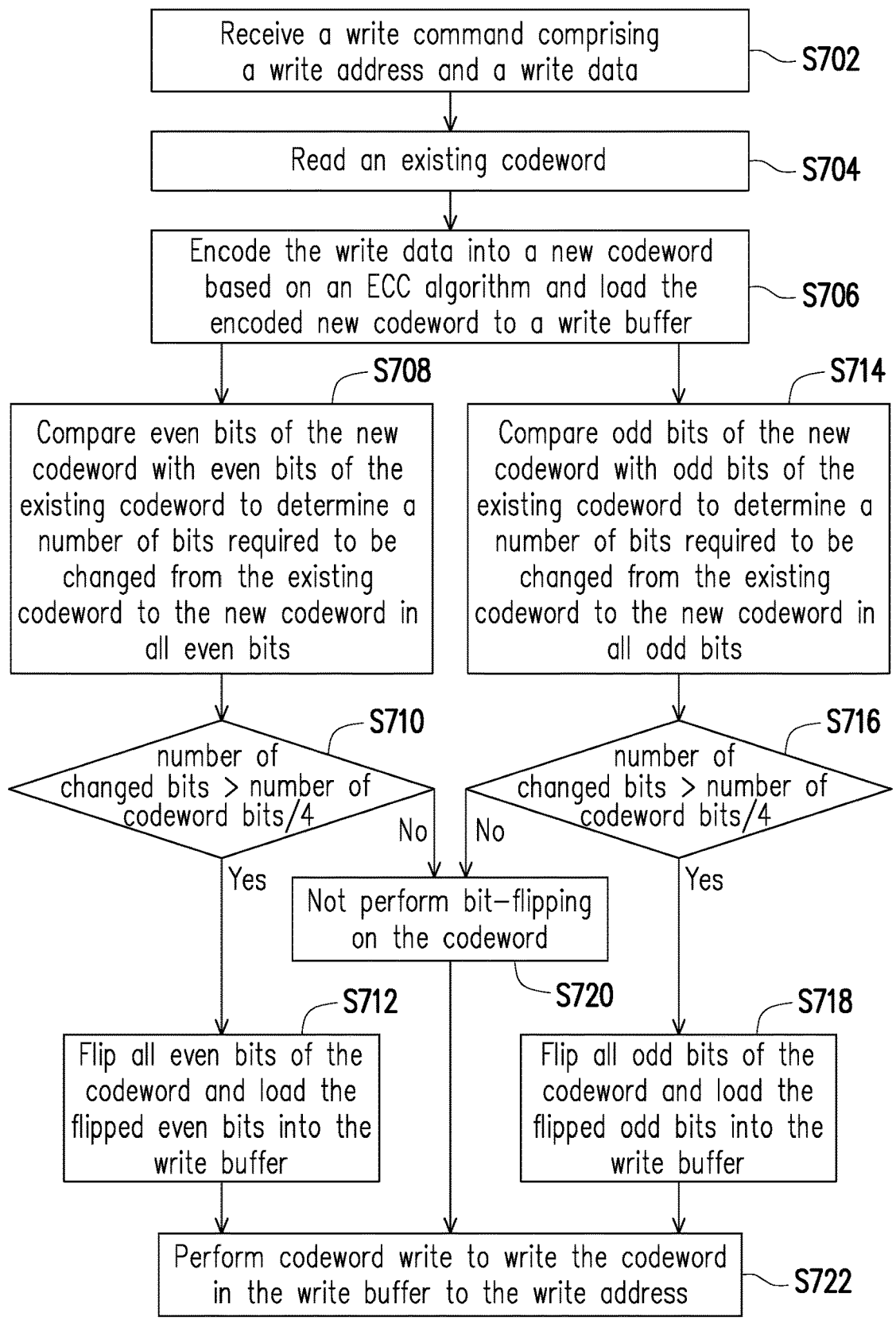
FIG. 7 is a flowchart illustrating an encoding method for a memory storage apparatus according to an embodiment of the invention.

FIG. 7 is a flowchart illustrating an encoding method for a memory storage apparatus according to an embodiment of the invention. The encoding method may be performed by the memory storage apparatus 100 of the embodiment of FIG. 1. Therefore, the encoding method will be illustrated by referring to the aforementioned memory storage apparatus 100 in the present embodiment.

Referring to FIG. 7, the memory control circuit 130 receives a write command comprising a write address and a write data (step S702). In response to the received write command, the ECC encoder 131 of the memory control circuit 130 previously reads an existing codeword (step S704). In one embodiment, the existing codeword is a codeword previously stored in the write address, and in another embodiment, the existing codeword is a codeword with a predefined data pattern (e.g., 000000 . . . , or FFFFFF . . . ), which is not limited herein.

Meanwhile, the ECC encoder 131 encodes the write data into a new codeword based on an ECC algorithm without flipping the bits of the new codeword and loads the new codeword to a write buffer (step S706). To be specific, the ECC encoder 131 may attach two flip bits to the write data, calculate a parity data of the write data and the flip bits based on the ECC algorithm, combine the parity data, the write data, and the flip bits to generate the new codeword, and load the new codeword to the write buffer in the step S706. In this embodiment, the flip bits attached include a first flip bit for indicating the bit-flipping of the even bits and a second flip bit for indicating the bit-flipping of the odd bits.

The ECC encoder 131 then executes steps S708 and S714 in parallel or in a sequence. It is noted that in this invention, one's complement of the encoded new codeword is also a codeword.

In step S708, the ECC encoder 131 compares even bits of the new codeword with even bits of the existing codeword to determine a number of bits required to be changed from the existing codeword to the new codeword in all even bits, and then determines whether the determined number is over a quarter of a number of codeword bits (step S710). If yes, the ECC encoder 131 flips all even bits of the codeword and loads the flipped even bits into the write buffer (step S712).

Similarly, in step S714, the ECC encoder 131 compares odd bits of the new codeword with odd bits of the existing codeword to determine a number of bits required to be changed from the existing codeword to the new codeword in all odd bits, and then determines whether the determined number is over a quarter of a number of codeword bits (step S716). If yes, the ECC encoder 131 flips all odd bits of the codeword and loads the flipped odd bits into the write buffer (step S718).

It is noted, in the steps S710 and S716, if the determination result is no, then the ECC encoder 131 does not perform bit-flipping on the codeword (step S720) and therefore there is no change in the write buffer. It is noted that, in each portion of the even bits and the odd bits, the ECC encoder 131 does not perform bit-flipping if the number of bits to be changed is the same as a number of bits not to be changed.

Finally, the ECC encoder 131 performs codeword write to write the codeword in the write buffer to the write address (step S722).

Based on the above, since the number of bits changed from the existing codeword to the new codeword is reduced by selectively and separately flipping the even bits and the odd bits of the codeword to be written, the write time and power can be further reduced and the reliability can be further improved.

Figure 8:
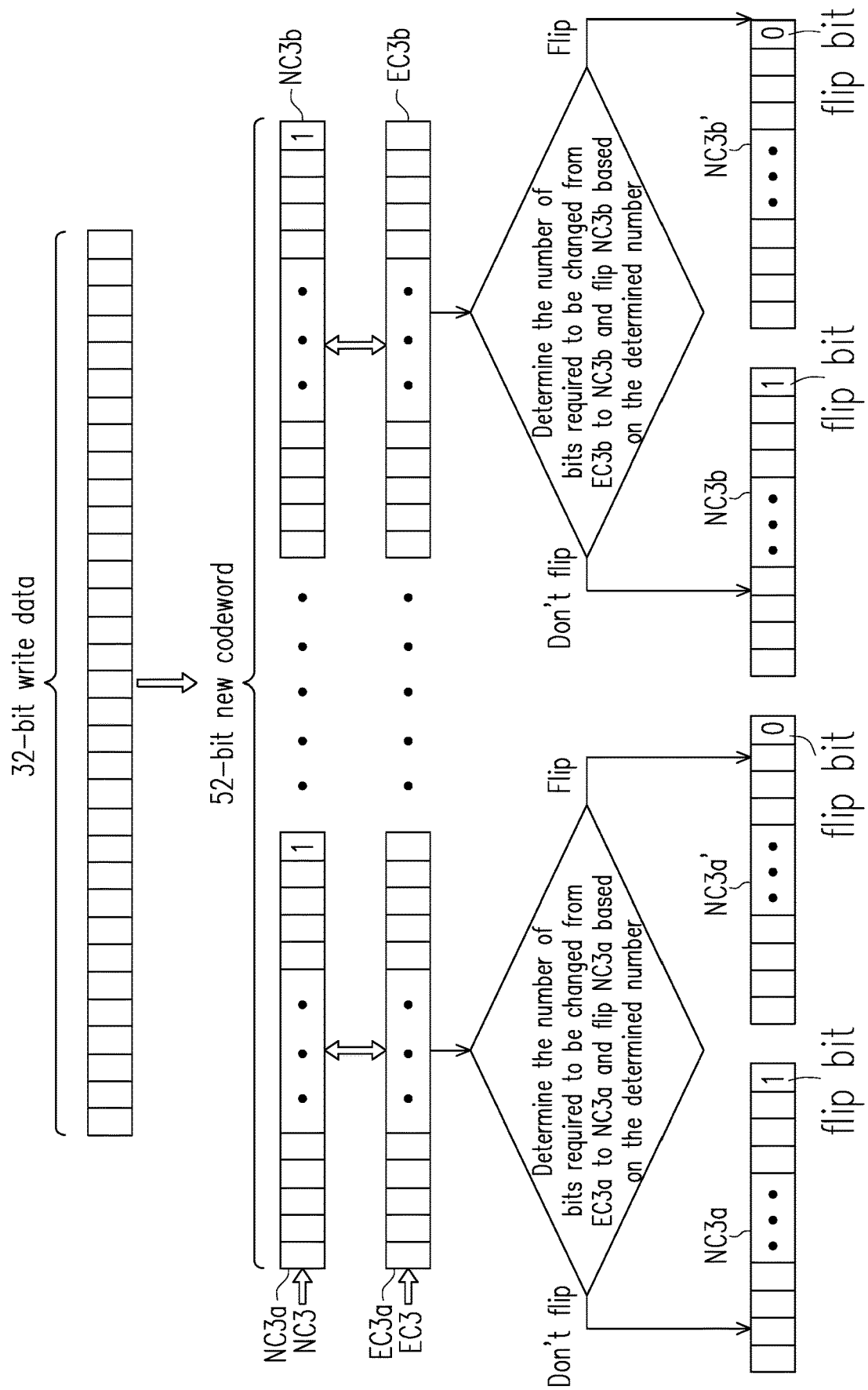
FIG. 8 is a schematic diagram illustrating an encoding method adopting an ECC algorithm modified by BCH (52, 34, 7) according to another embodiment of the invention.

For example, FIG. 8 is a schematic diagram illustrating an encoding method adopting an ECC algorithm modified by BCH (52, 34, 7) according to another embodiment of the invention. Referring to FIG. 8, when receiving a write data, the ECC encoder 131 encodes the write data into a 52-bit new codeword NC3 by using the ECC algorithm similar to the ECC algorithm as described in the embodiment of FIG. 3. It is noted that, in this embodiment, the ECC encoder 131 first attaches two flip bits to the write data, and encodes the data bits and the flip bits to a 52-bit new codeword. In some embodiments, the two flip bits individually indicate the bit-flipping of all even data bits and all odd data bits in the codeword. In some embodiments, the two flip bits attached are set with a first value (i.e. logic 1) which indicates no bit-flipping of the codeword. When bit-flipping is performed to the even bits or odd bits of the codeword, the corresponding flip bit is also flipped to a second value (i.e. logic 0) which indicates the bit-flipping of the codeword.

In some embodiments, in response to receiving the write command, the ECC encoder 131 also reads out a 52-bit existing codeword EC3 including two flip bits.

Then, the ECC encoder 131 compares a plurality of even bits NC3a of the new codeword NC3 with a plurality of even bits EC3a of the existing codeword EC3 to determine the number of bits required to be changed from the existing codeword EC3 to the new codeword NC3 in all even bits. Meanwhile, the ECC encoder 131 also compares a plurality of odd bits NC3b of the new codeword NC3 with a plurality of odd bits EC3b of the existing codeword EC3 to determine the number of bits required to be changed from the existing codeword EC3 to the new codeword NC3 in all odd bits. Further, it is noted that in this invention, one's complement of any portion (i.e. even bits or odd bits) of the encoded new codeword is also a codeword.

Finally, the ECC encoder 131 flips the even bits NC3a of the new codeword NC3 based on the determined number of bits required to be changed in the even bits, flips the odd bits NC3b of the new codeword NC3 based on the determined number of bits required to be changed in the odd bits, and writes the entire new codeword comprising the two flip bits to the write address. Specifically, the ECC encoder 131 determines whether the determined number of bits required to be changed in the even bits is over a quarter of a number of codeword bits. If yes, the ECC encoder 131 flips all the even bits NC3a of the new codeword NC3 and loads the flipped new codeword NC3a' comprising the flip bit to the write buffer. If no, the ECC encoder 131 does not perform bit-flipping on the even bits NC3a of the new codeword NC3. Similarly, the ECC encoder 131 determines whether the determined number of bits required to be changed in the odd bits is over a quarter of a number of codeword bits. If yes, the ECC encoder 131 flips all the odd bits NC3b of the new codeword NC3 and loads the flipped new codeword NC3b' comprising the flip bit to the write buffer. If no, the ECC encoder 131 does not perform bit-flipping on the odd bits NC3b of the new codeword NC3. Then, the entire codeword including all even bits and all odd bits in the write buffer is written into the memory array 150.

In the aforesaid embodiments, the even bits and odd bits changed from the existing codeword to the encoded codeword are minimized based on the encoding method of the invention. However, in some embodiments, the bits changed in parity bits in the first portion or second portion are minimized based on the encoding method provided in this invention, but the disclosure is not limited thereto.

In summary, in the encoding method and the memory storage apparatus provided in the invention, an ECC algorithm is introduced to implement a NVM flip bit write function with BCH ECC algorithm, in which one or more flip bits are adopted to indicate codeword bits flipping on different portions of the codeword bits. As a result, the number of bit change in writing can be reduced and write time and power can be reduced. Further, the endurance of the memory apparatus is improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An encoding method for a memory storage apparatus adopting an error correcting code (ECC) algorithm, comprising:

receiving a write command comprising a write address and a write data;

reading an existing codeword;

attaching a flip bit to the write data;

encoding the write data and the flip bit to generate a plurality of parity bits based on the ECC algorithm by an ECC encoder and attaching the write data and the flip bit to the plurality of parity bits to generate a new codeword;

flipping the new codeword based on a number of bits among selected bits required to be changed from the existing codeword to the new codeword; and writing one of the new codeword and the flipped new codeword to the write address.

2. The encoding method as claimed in claim 1, wherein no bit-flipping is performed if the number of bits to be changed is the same as a number of bits not to be changed.

3. The encoding method as claimed in claim 1, wherein one's complement of any codeword of the existing codeword and the new codeword is also a codeword.

4. The encoding method as claimed in claim 1, wherein each codeword of the existing codeword and the new codeword comprises a first flip bit contained in a first portion of the codeword and further comprises a second flip bit contained in a second portion of the codeword.

5. The encoding method as claimed in claim 4, wherein one's complement of the first portion or the second portion of any codeword of the new codeword and the existing codeword is also a codeword.

6. The encoding method as claimed in claim 4, wherein in each portion of the first portion and the second portion, no bit-flipping is performed if the number of bits to be changed is the same as a number of bits not to be changed.

7. The encoding method as claimed in claim 1, wherein the selected bits are the parity bits or the parity bits and data bits.

8. A memory storage apparatus adopting an ECC algorithm, comprising:

a connection interface configured to couple to a host system;

a memory array; and a memory control circuit coupled to the connection interface and the memory array, and configured to perform an encoding operation based on the ECC algorithm in response to receiving a write command comprising a write address and a write data, wherein the encoding operation comprises:

reading an existing codeword;

attaching a flip bit to the write data;

encoding the write data and the flip bit to generate a plurality of parity bits based on the ECC algorithm by an ECC encoder and attaching the write data and the flip bit to the plurality of parity bits to generate a new codeword;

flipping the new codeword based on a number of bits among selected bits required to be changed from the existing codeword to the new codeword; and writing one of the new codeword and flipped new codeword to the write address.

9. The memory storage apparatus as claimed in claim 8, wherein the memory control circuit is configured to not perform bit-flipping if the number of bits to be changed is the same as a number of bits not to be changed.

10. The memory storage apparatus as claimed in claim 8, wherein each codeword of the existing codeword and the new codeword comprises a first flip bit contained in a first portion of the codeword and further comprises a second flip bit contained in a second portion of the codeword.

11. The memory storage apparatus as claimed in claim 10, wherein in each portion of the first portion and the second portion, the memory control circuit is configured to not perform bit-flipping if the number of bits to be changed is the same as a number of bits not to be changed.

12. The memory storage apparatus as claimed in claim 8, wherein the selected bits are the parity bits or the parity bits and data bits.

* * * * *